(12) United States Patent
Walberg et al.

(10) Patent No.: US 7,728,399 B2
(45) Date of Patent: Jun. 1, 2010

(54) MOLDED OPTICAL PACKAGE WITH FIBER COUPLING FEATURE

(75) Inventors: Randall L. Walberg, Campbell, CA (US); Luu T. Nguyen, San Jose, CA (US); Robert Dahlgren, Santa Cruz, CA (US); James B. Wieser, Pleasanton, CA (US); Kenneth Pedrotti, Santa Cruz, CA (US); Jacob A. Wysocki, Santa Cruz, CA (US)

(73) Assignees: National Semiconductor Corporation, Santa Clara, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 12/177,677

(22) Filed: Jul. 22, 2008

(65) Prior Publication Data
US 2010/0019339 A1    Jan. 28, 2010

(51) Int. Cl.
| H01L 31/0203 | (2006.01) |
| H01L 31/0232 | (2006.01) |
| H01L 29/22 | (2006.01) |
| H01L 29/227 | (2006.01) |
| H01L 33/00 | (2006.01) |
| H01L 29/24 | (2006.01) |
| H01L 29/417 | (2006.01) |
| H01L 29/74 | (2006.01) |
| H01L 31/111 | (2006.01) |

(52) U.S. Cl. .......................... 257/434; 257/98; 257/99; 257/100; 257/116; 257/117; 257/118; 257/432; 257/433; 257/E33.056; 257/E33.058; 257/E33.059; 257/E33.066; 257/E33.073

(58) Field of Classification Search ........... 257/98–100, 257/116–118, E33.056, E33.058, E33.059, 257/E33.066, E33.073, 432–434
See application file for complete search history.

(56) References Cited

U.S. PATENT DOCUMENTS

| 4,663,833 | A | | 5/1987 | Tanaka et al. ................ 438/65 |
| 4,766,095 | A | | 8/1988 | Hiroshi ....................... 438/116 |
| 4,971,930 | A | | 11/1990 | Fusaroli et al. ............. 438/116 |
| 5,034,800 | A | | 7/1991 | Marchisi ..................... 257/695 |
| 5,359,208 | A | * | 10/1994 | Katsuki et al. ................ 257/82 |
| 5,434,939 | A | * | 7/1995 | Matsuda ....................... 385/88 |

(Continued)

FOREIGN PATENT DOCUMENTS

JP           62-174956           7/1987

OTHER PUBLICATIONS

U.S. Appl. No. 12/037,007, filed Feb. 25, 2008.

(Continued)

*Primary Examiner*—Ida M Soward
(74) *Attorney, Agent, or Firm*—Beyer Law Group LLP (57) ABSTRACT

Apparatuses and methods directed to an integrated circuit package having an optical component are disclosed. The package may include an integrated circuit die having at least one light sensitive region disposed on a first surface thereof. By way of example, the die may be a laser diode that emits light through the light sensitive region, or a photodetector that receives and detects light through the light sensitive region. An optical concentrator may be positioned adjacent the first surface of the first die. The optical concentrator includes a lens portion positioned adjacent the light sensitive region and adapted to focus light.

24 Claims, 8 Drawing Sheets

U.S. PATENT DOCUMENTS

| | | | | |
|---|---|---|---|---|
| 5,542,018 | A * | 7/1996 | Kuhara et al. | 385/92 |
| 5,598,034 | A * | 1/1997 | Wakefield | 257/706 |
| 5,907,151 | A * | 5/1999 | Gramann et al. | 250/214.1 |
| 5,925,898 | A * | 7/1999 | Spath | 257/98 |
| 6,735,023 | B2 | 5/2004 | Schunk | 359/808 |
| 6,849,915 | B1 * | 2/2005 | Tsai | 257/432 |
| 6,953,291 | B2 * | 10/2005 | Liu | 385/94 |
| 7,023,023 | B2 * | 4/2006 | Karnik et al. | 257/98 |
| 7,029,186 | B2 * | 4/2006 | Harazono | 385/93 |
| 7,179,680 | B2 | 2/2007 | Fries | 438/106 |
| 7,199,438 | B2 | 4/2007 | Appelt et al. | 257/433 |
| 7,378,645 | B2 * | 5/2008 | Mihara et al. | 250/239 |
| 7,420,754 | B2 * | 9/2008 | Nagasaka | 359/811 |
| 7,517,728 | B2 * | 4/2009 | Leung et al. | 438/122 |
| 7,531,842 | B2 * | 5/2009 | Gormley | 257/81 |
| 7,612,383 | B2 * | 11/2009 | Andrews et al. | 257/98 |
| 2004/0231409 | A1 * | 11/2004 | Lelong-Feneyrou et al. | 73/152.51 |
| 2005/0139848 | A1 * | 6/2005 | Yee | 257/98 |
| 2007/0081336 | A1 * | 4/2007 | Bierhuizen et al. | 362/293 |
| 2007/0114547 | A1 * | 5/2007 | Fujita et al. | 257/98 |
| 2007/0166866 | A1 | 7/2007 | Appelt et al. | 438/64 |
| 2008/0123198 | A1 * | 5/2008 | Fujita | 359/709 |
| 2009/0134421 | A1 * | 5/2009 | Negley | 257/98 |
| 2009/0179213 | A1 * | 7/2009 | Cannon et al. | 257/98 |
| 2009/0212306 | A1 * | 8/2009 | Bogner et al. | 257/98 |
| 2009/0250710 | A1 * | 10/2009 | Negley | 257/89 |

OTHER PUBLICATIONS

Int'l Search Report dated Dec. 30, 2009 from PCT Application No. PCT/US2009/043810.

Written Opinion dated Dec. 30, 2009 from PCT Application No. PCT/US2009/043810.

* cited by examiner

MOLDED OPTICAL PACKAGE WITH FIBER COUPLING FEATURE

TECHNICAL FIELD

The present invention relates generally to the packaging of integrated circuit devices. More particularly, the invention relates to integrated circuit packages that utilize optical components and arrangements and methods of coupling the optical components within integrated circuit packages.

BACKGROUND

Many integrated circuit ("IC") devices include optical components. Some of these devices require exposure to a source of light at a point during their operational cycle. Other devices may themselves be a source of light. In many such IC devices, and indeed in most all IC devices, the device must generally be enclosed in a sealed environment to protect it and its associated electrical connections from damage due to exposure to the outside environment. Accordingly, numerous conventional packages for IC devices involve the formation of an optically transparent window or other transparent component that enables light to reach one or more components on the IC device or, conversely, to be emitted by the components and exit the device.

While many of the devices and techniques to provide an optically transparent window in an IC device via a packaging feature have generally worked well in the past, there is a desire to provide more reliable and cost effective ways for packaging IC devices with optical components and, furthermore, means to couple high BW signals into optical transmission media such as optic fiber.

SUMMARY

Apparatuses and methods directed to an integrated circuit package having an optical component are disclosed. In one aspect, a package is described that includes an integrated circuit die having at least one light sensitive region disposed on a first surface thereof. By way of example, the die may be a laser diode that emits light through the light sensitive region, or a photodetector that receives and detects light through the light sensitive region. An optical concentrator is positioned adjacent the first surface of the first die. The optical concentrator includes an optical fiber coupling feature arranged to align an inserted optical fiber with a lens portion of the optical coupling concentrator. The lens portion is positioned adjacent the light sensitive region and adapted to focus light from the light sensitive region into a core of the optical fiber and/or to focus light received from the core of the optical fiber onto the light sensitive region.

In some embodiments, the package may further include a second die having a second sensitive region. The package may also include a second optical coupling concentrator that includes a second lens portion positioned adjacent the light sensitive region of the second die. Such a package may be configured for duplex communication wherein the first die is configured to transmit light through the lens portion of the optical coupling concentrator associated with the first die and into the core of the optical fiber associated with the first die, and wherein the second die is configured to receive light through the lens portion of the second optical coupling concentrator from the core of the second optical fiber.

In still another embodiment, the first die may include at least two light sensitive regions. In such an embodiment, the optical coupling concentrator may include at least two lens portions, a first one of the lens portions being positioned adjacent a first one of the light sensitive regions and a second one of the lens portions being positioned adjacent a second one of the light sensitive regions. The optical coupling concentrator may include an optical fiber coupling feature arranged to align a first inserted optical fiber with the first one of the lens portions and a second inserted optical fiber with the second one of the lens portions. Such a package may be configured for parallel communication applications.

In another aspect, an optical coupling concentrator is described that may be arranged for use in an integrated circuit package such as those just described.

In yet another aspect, a method is described for making an optical package such as those just described.

Variations and features of one or more of the foregoing embodiments can be included in another embodiment, and additional variations and features can be used in any one of the foregoing embodiments, as may be desired. Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

Example applications of apparatuses and methods according to the present invention are described in this section. These examples are being provided to add context and aid in the understanding of the invention. It will thus be apparent to one skilled in the art that the present invention may be practiced without some or all of these specific details. In other instances, well known process steps have not been described in detail in order to avoid unnecessarily obscuring the present invention.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

Figure 1:
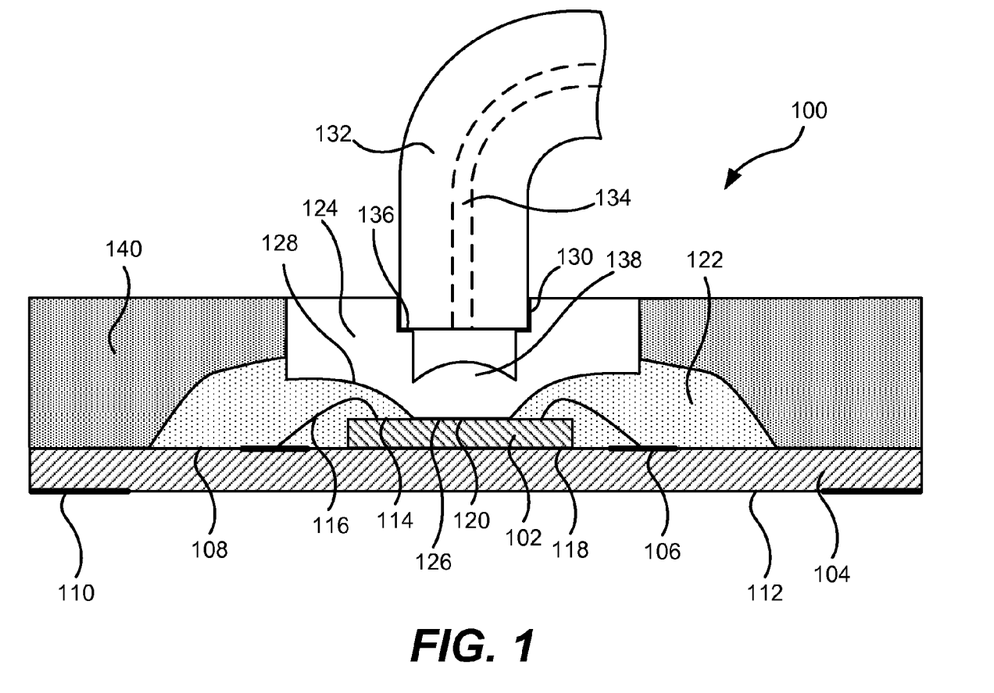
FIG. 1 illustrates an example optical IC package in accordance with an embodiment of the present invention.
Figure 2:
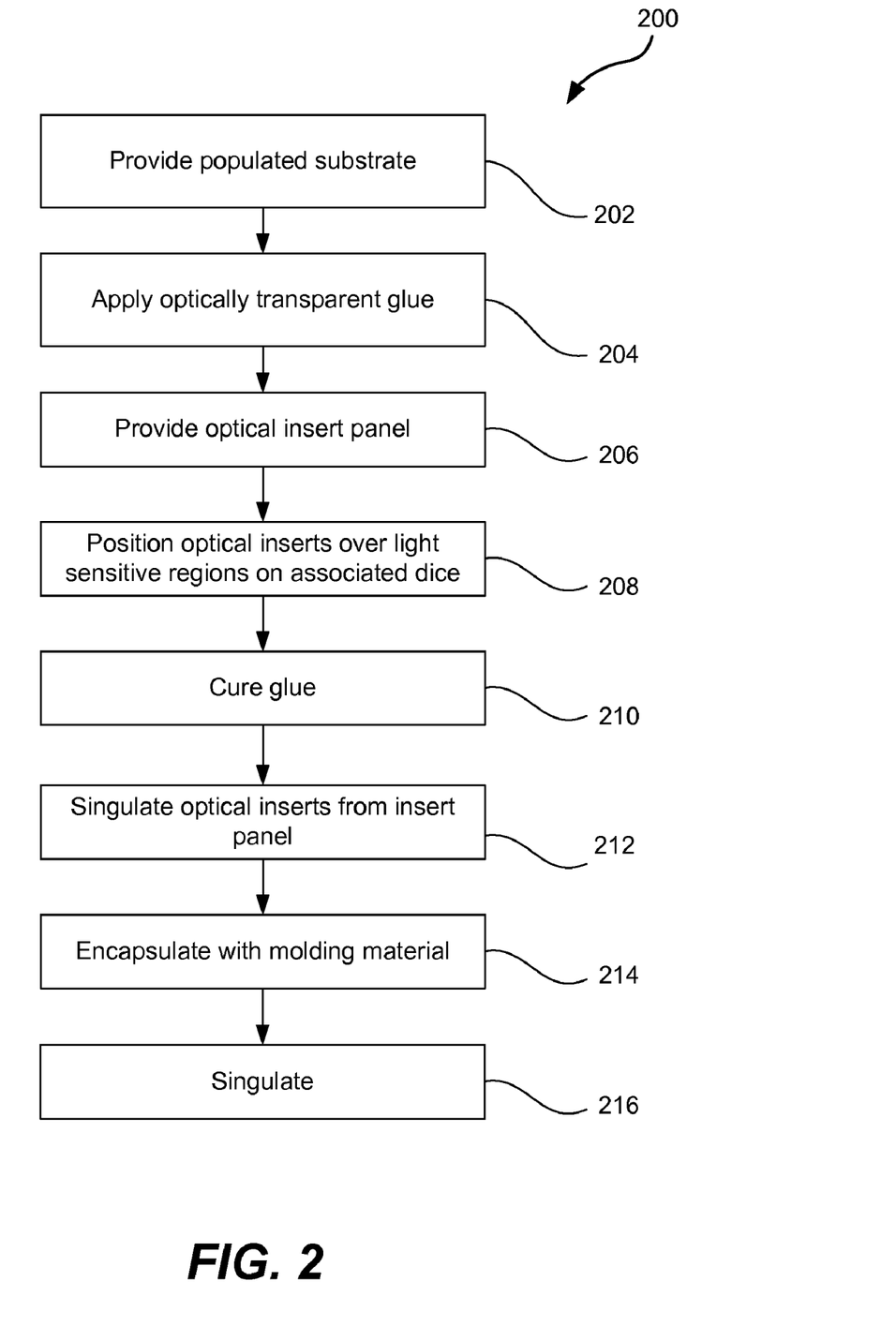
FIG. 2 is a flow chart illustrating an example process for packaging an optical IC device in accordance with an embodiment of the present invention.

Referring first to FIG. 1, an example optical package 100 according to a particular embodiment is illustrated in side cross-sectional view. Package 100 includes an integrated circuit (IC) die 102 which may be physically and electrically connected with a substrate 104. In one particular embodiment, substrate 104 is a laminate based substrate suitable for use in producing laminate chip scale packages (CSPs). Such a laminate based substrate 104 is generally formed from a dielectric material. By way of example, the substrate 104 may be formed of a glass filled epoxy such as high temperature FR4. Laminate based substrate 104 generally includes internal contact pads 106 on a top surface 108 of the substrate as well as external contact pads 110 on a bottom surface 112 of the substrate. Each internal contact pad 106 may be electrically connected with an associated external contact pad 110 with one or more associated vias and traces patterned through the dielectric material. However, applications of the invention are not limited to laminate CSPs as the die 102 may be packaged according to a variety of other formats understood in the art including, by way of example, plastic ball grid array (PBGA) packages, leadless leadframe packages (LLPs), and other leadframe packages such as those produced by National Semiconductor Corporation of Santa Clara, Calif. In general, the substrate 104 may include, by way of example, 16, 20, 24, 28, 48 or 96 external contact pads 110, although other external contact pad counts are permitted.

I/O pads (hereinafter also referred to as bond pads) on the active surface 114 of the die 102 may be electrically connected with associated internal contact pads 106 via bonding wires 116. The back surface 118 of the die 102 may be physically connected with the top surface 108 of the substrate 104 with a suitable die attach adhesive or film. In embodiments in which a leadframe is utilized, the back surface 118 of the die 102 may be connected to a top surface of a die attach pad (DAP) if present.

The die 102 includes at least one light sensitive region 120 at some position on the active surface 114 of the die. In various embodiments, the die 102 takes the form of a semiconductor laser diode, and in a particular embodiment, the die 102 comprises a vertical-cavity surface-emitting laser (VCSEL). In these embodiments, the die 102 may be configured to emit a laser beam out through the light sensitive region 120 on the active surface of the die. In one specific embodiment, the VCSEL may be configured to emit light at approximately 850 nm. In other embodiments, the die 102 takes the form of a photodetector that receives and detects light through the light sensitive region 120.

In the illustrated embodiment, an optically transparent glue 122 surrounds the light sensitive region 120 around the periphery of the die 102. As will be readily understood, the term "translucent" may be used in place of the terms "transparent" or "clear" for many of the items, materials and/or other light specific applications throughout this disclosure. In a specific embodiment, the optically transparent glue 122 is an ultraviolet (UV) curable glue that cures in response to exposure to UV light. In another embodiment, a snap cure die attach process can be used to cure an optically transparent die attach material 122. In such an embodiment, the optical package 100 may be exposed to a quick thermal ramp from approximately 80 to 120° C. for a short duration (e.g., less than 10 seconds in one embodiment) to cure the auto-catalyzed die attach material. Various combinations of UV-curable and auto-catalyzable die attach materials may also be utilized.

Optical package 100 additionally includes an optical concentrator 124 (hereinafter also referred to as an optical insert, optical coupler, or optical coupling concentrator) positioned over the light sensitive region 120. In various embodiments, optical concentrator 124 is comprised of a high temperature rated polymer. In a particular embodiment, the high-temperature rated polymer is a thermoplastic such as, by way of example, a polyetherimide (e.g., Ultem™, Siltem™, or Extem™) or other polyimide. The use of a high temperature rated thermoplastic may be desirable as the optical concentrator 124 is preferably able to withstand typical high temperature packaging processes. As will be appreciated by those of skill in the art, a typical die attach and cure process may run at 150° C. for 4 hours, a typical wire bonding process may run at 200° C. for 5 minutes, and a typical encapsulant molding process may run at 175° C. or greater for 5 minutes. In particular embodiments, optical concentrator 124 is formed by means of an injection molding process. Additionally, although a specific optical concentrator 124 is shown in FIG. 1, it will be understood that variations exist and are included in the scope of the present invention.

A bottom surface 126 of the optical concentrator 124 may be in close proximity to or in contact with the light sensitive region 120. In embodiments in which there is a gap between the bottom surface 126 of the optical concentrator 124 and the surface of the light sensitive region 120, the gap may be filled with the optically transparent glue 122. In the illustrated embodiment, optical concentrator 124 also includes a curved portion 128. Curved portion 128 generally provides clearance for the bonding wires 116. Optical concentrator 124 also includes a recess 130 in the illustrated embodiment. Recess 130 is appropriately sized and shaped to receive an end of an associated optical fiber 132. More specifically, recess 130 may be arranged to align the core 134 of the optical fiber 132 with the light sensitive region 120. Furthermore, a lip or ledge 136 may be incorporated at some midway section around the recess 130. The lip 136 may be sized and positioned so that the end of the optical fiber 132 abuts the lip 136 such that the end of the optical fiber is positioned at a fixed predetermined distance from the light sensitive region 120.

In various preferred embodiments, optical concentrator 124 advantageously includes a lens portion (hereinafter also referred to as "lens") 138. In the illustrated embodiment, lens 138 is an integral part of optical concentrator 124. In a number of embodiments, lens 138 assumes a convex lens shape as shown. As will be understood by those of skill in the art, a collimated or parallel beam of light travelling parallel to a convex lens axis and passing through the lens will be converged or focused to a spot on the axis, at a certain distance behind the lens (known as the focal length). It should be noted that the lip 136 may be positioned to take advantage of the focal length of the lens 138; that is, such that light emitted by the light sensitive region 120 is focused into the core 134 of the optical fiber 132 or, conversely, light received from the core 134 of the optical fiber is focused to the light sensitive region 120.

Generally, the size and shape of the lens 138 will be determined based on the characteristics of the optical fiber 132 (e.g., the diameter and composition of the core 134 for example) and light sensitive region 120. In one preferred embodiment, a plastic multimode optical fiber is utilized. The plastic multimode fiber 132 may have, by way of example, a core diameter in the range of 62 to 120 μm, although other diameters both larger and smaller are permitted. Those of skill in the art will appreciate that multimode fibers support multiple propagation paths or transverse modes while singlemode fibers support only a single mode. Additionally, multimode fibers generally have a larger core diameter and are typically used for shorter distance communication (e.g., under 200 m for example). Furthermore, as a result of the smaller core diameters of single mode fibers, tighter tolerances are generally required to couple light into singlemode fibers. The use of plastic multimode optical fibers may be advantageous in particular short distance embodiments as a result of the looser tolerances required with multimode fibers, which make it easier to align these fibers within associated optical packages. Those of skill in the art will also appreciate that plastic optical fibers cause greater optical attenuation than glass optical fibers. The inventors have determined that the greater attenuation exhibited by plastic optical fibers may be exploited in multimode fibers over short distances to mitigate problems associated with time delays that may result from imprecise alignment of the laser beam with the core of the fiber.

In various embodiments, the die 102, bonding wires 116, and portions of the substrate 104 and optical concentrator 124 are encapsulated with a molding compound 140. In the illustrated embodiment, the molding compound 140 is formed from a conventional optically opaque thermoplastic or thermosetting plastic material. In other embodiments, the molding compound 140 may be formed of an optically transparent material, in which case, the optically transparent glue 122 may not be required as any mold flash that may occur between the bottom surface 126 of the optical concentrator 124 and the light sensitive region 120 would be transparent.

With reference to the flow chart of FIG. 2 and FIGS. 3A-D, a process 200 for packaging an integrated circuit die for use in optical applications according to example embodiments of the present invention will be described. In some particular embodiments, process 200 may be used to construct the package 100 described above with reference to FIG. 1. Process 200 begins at 202 with providing a substrate panel 304 populated with a number of integrated circuit dice 302. Each integrated circuit die 302 is electrically connected with corresponding contacts on the substrate panel 304 via bonding wires 316. One or more integrated circuit dice each additionally include a light sensitive region 320 through which light may be emitted or received depending upon the configuration of the die. Although only a single die is shown in the example illustrated in FIG. 3A, it will be understood that substrate panel 304 may have tens or more dice attached and electrically connected thereto within associated device areas, which themselves may be grouped into a number of two-dimensional arrays of device areas.

In some embodiments, including those in which the dice will later be encapsulated with an optically opaque molding compound, an optically transparent glue 322 is applied at 204 over and around at least the periphery of each die 302. In the embodiment illustrated in FIG. 3B, the optically transparent glue 322 is applied as a single glob over each die 302. Additionally, in this embodiment, the glue 322 is applied in a suitable volume such that the glue 322 engulfs the bonding wires 316.

Figure 4A:
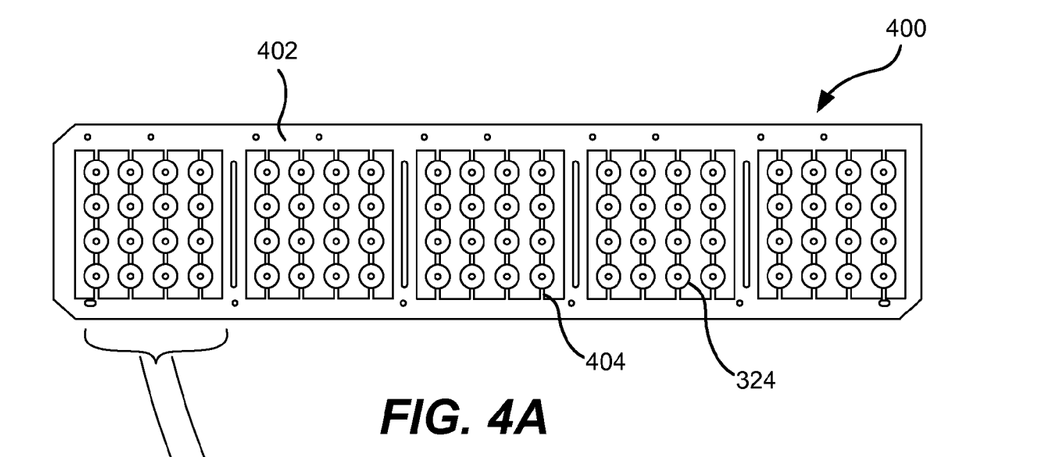
FIGS. 4A-4C illustrate top, expanded top and cross-sectional side views, respectively, of an example insert panel in accordance with an embodiment of the present invention.
Figure 4B:
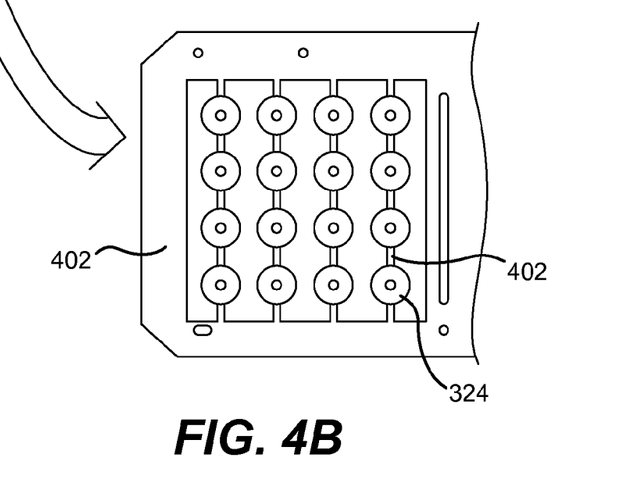
Figure 4C:
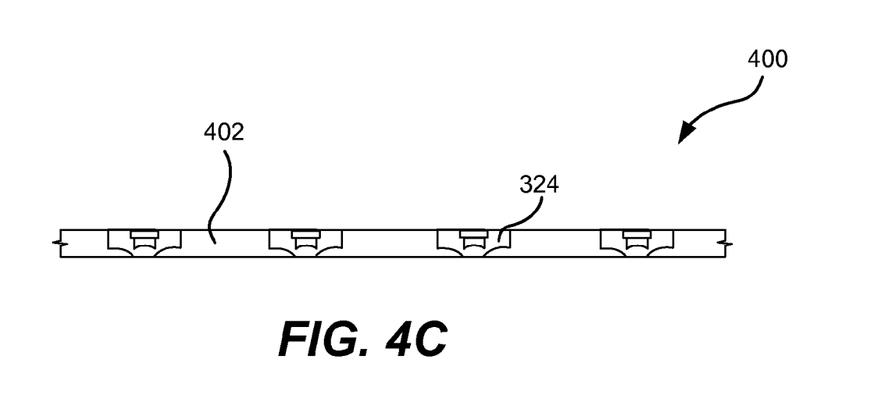

At 206 an optical insert panel is provided. One embodiment of a suitable insert panel 400 is illustrated in FIGS. 4A-4C. Insert panel 400 generally comprises a frame 402 and insert support members 404. Each support member 404 supports one or more optical concentrators 324. In particular embodiments, insert panel 400 may have a footprint similar to that of the associated leadframe panel or other substrate 304 to which the dice 302 are attached. More specifically, the number and arrangement of optical concentrators 324 within the optical insert panel 400 may match the associated number and arrangement of device areas of the associated leadframe panel or other substrate 304. In various embodiments, the optical concentrators 324 are integrally formed with insert panel 400 in an injection molding process.

Although a particular insert panel 400 and associated arrangement of optical concentrators 324 are shown in the embodiment illustrated in FIGS. 4A-4C, it should be noted that embodiments of the invention are not limited to this particular arrangement as other panels and arrangements are permitted. Generally, as described above, each array of optical concentrators 324 may correspond in layout and number to an associated array of populated device areas from the associated substrate 304 such that all of the optical concentrators 324 of an entire panel 400 may be simultaneously positioned over dice 302 within corresponding device areas of an entire substrate 304.

At 208 the optical insert panel 400 may be positioned over the substrate panel 304 such that each optical concentrator 324 is positioned adjacent an associated die 302. In the embodiment illustrated in FIG. 3C, a suitable volume of optically transparent glue 322 is provided at 204 over each die 302 such that the glue engulfs the associated electrically connections 316 (e.g., bonding wires) when the associated optical concentrator 324 is positioned over the die. The optically transparent glue may then be cured at 210. By way of example, if the optically transparent glue 322 is a UV curable glue, then the glue 322 may be cured through exposure to UV light, heat, or a combination of both. In some embodiments, the optical concentrators 324 may then be singulated from the insert panel 400 at 212. The optical concentrators 324 may be readily severed via known methods such as sawing or laser cutting.

Figure 5:
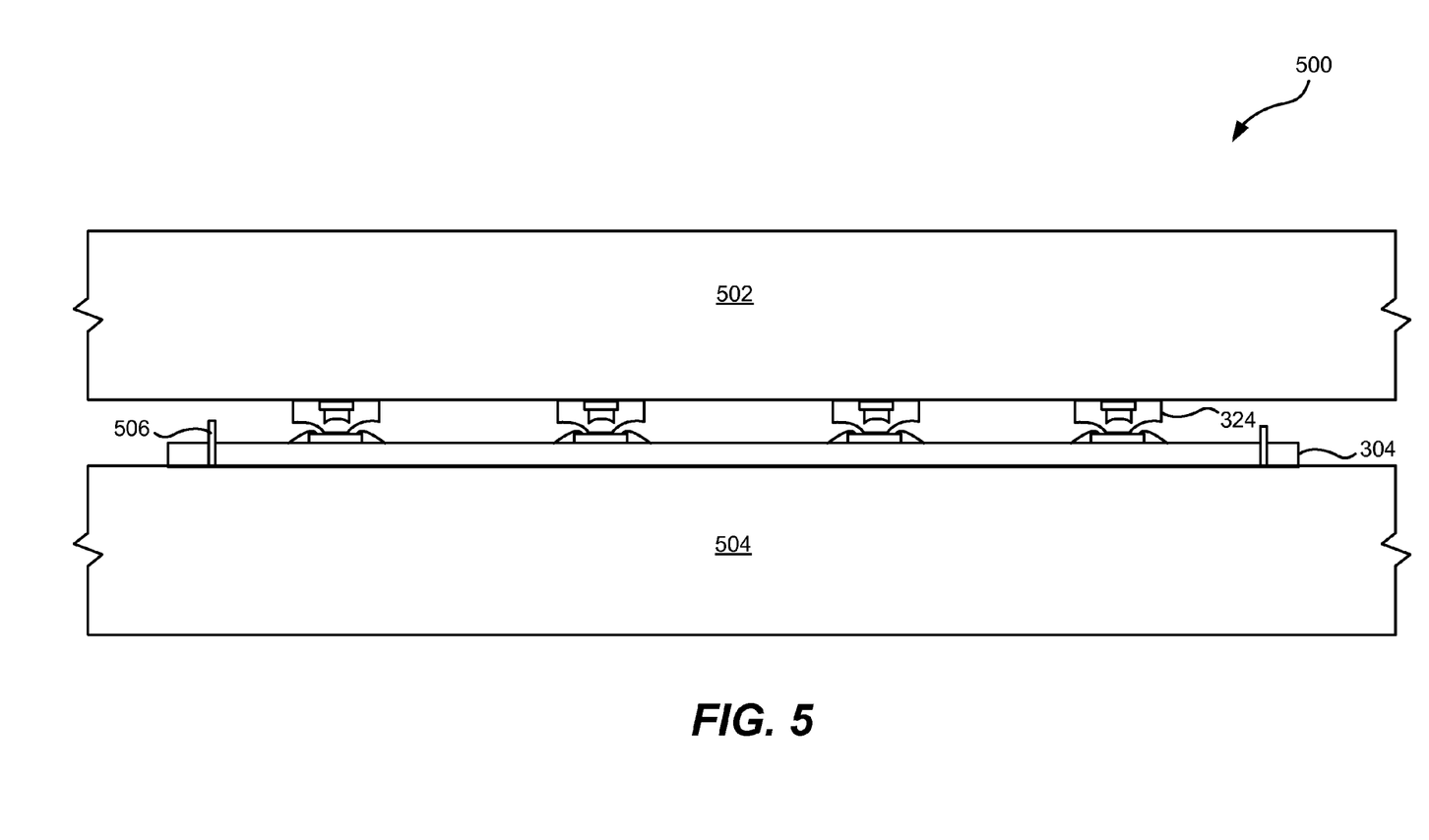
FIG. 5 illustrates an example arrangement for encapsulating optical IC packages utilizing a pre-molded optical insert in accordance with an embodiment of the present invention.

At 214, the substrate 304 and optical concentrators may be encapsulated with a molding compound 340. FIG. 5 illustrates an example mold 500 suitable for use in encapsulating the dice 302, electrical connections 316 (e.g., bonding wires) and portions of the substrate panel 304 and optical concentrators 324 with molding compound. In some embodiments, mold 500 is configured as a film assisted molding (FAM) system. As shown, mold 500 includes an upper mold cap 502 and a lower mold block 504. Substrate panel 304 is positioned over the lower mold block 504 and aligned with mold pins 506. Liquid molding compound is injected into the cavity formed between the upper mold cap 502 and the lower mold block 504. The molding compound 340 used to encapsulate the devices may, for example, be any suitable plastic or other type of molding compound typically used for encapsulating IC devices. By way of example, various conventional silica-based compounds are known to work well for such encapsulating purposes, and are also known as good materials for absorbing and reducing stresses and thermal shocks to the resulting packaged devices. As is well known, many such molding compounds are opaque in nature, and black is a typical known color. In embodiments in which an optically opaque conventional or other optically opaque molding compound is used in the encapsulation, the optically transparent glue prevents flashing of the optically opaque molding material over the light sensitive regions 320 on the active surfaces of the dice 302.

Figure 3A:
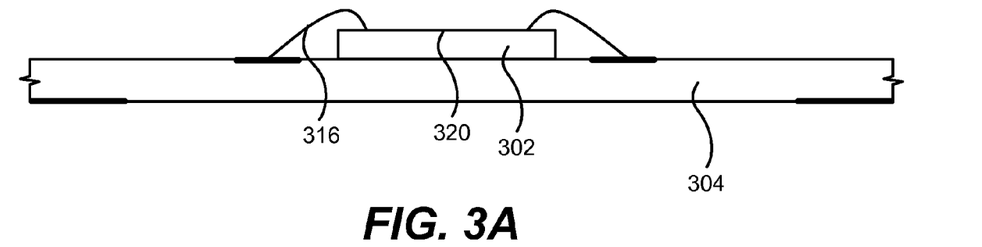
FIGS. 3A-3D illustrate cross-sectional side views of a substrate at various stages in the process of FIG. 2.
Figure 3B:
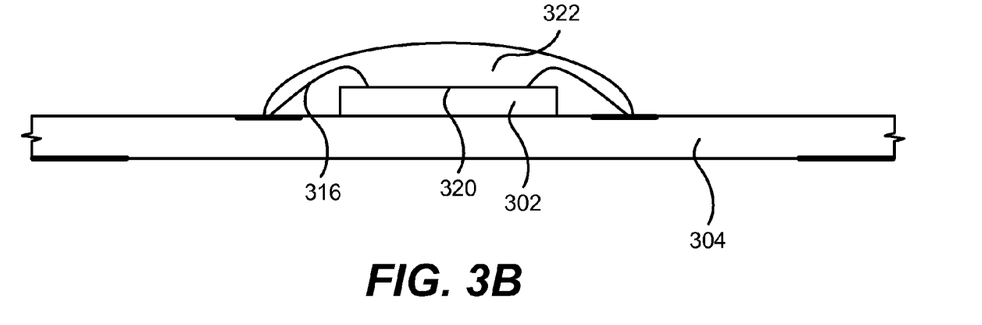
Figure 3C:
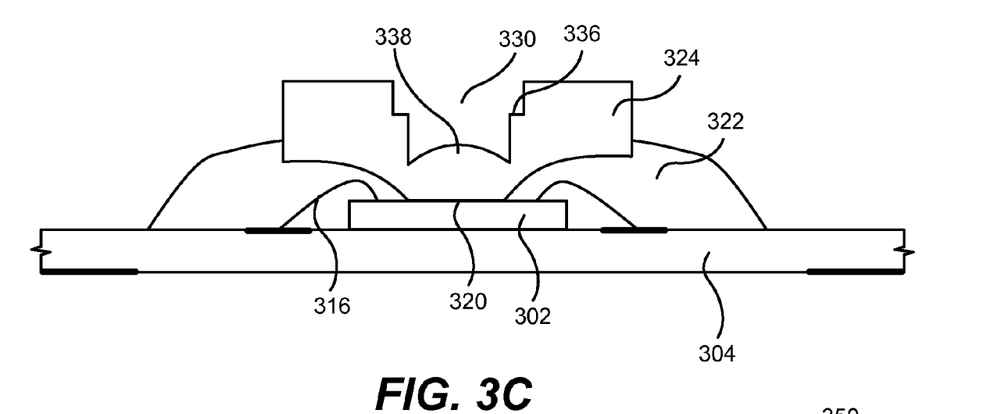
Figure 3D:
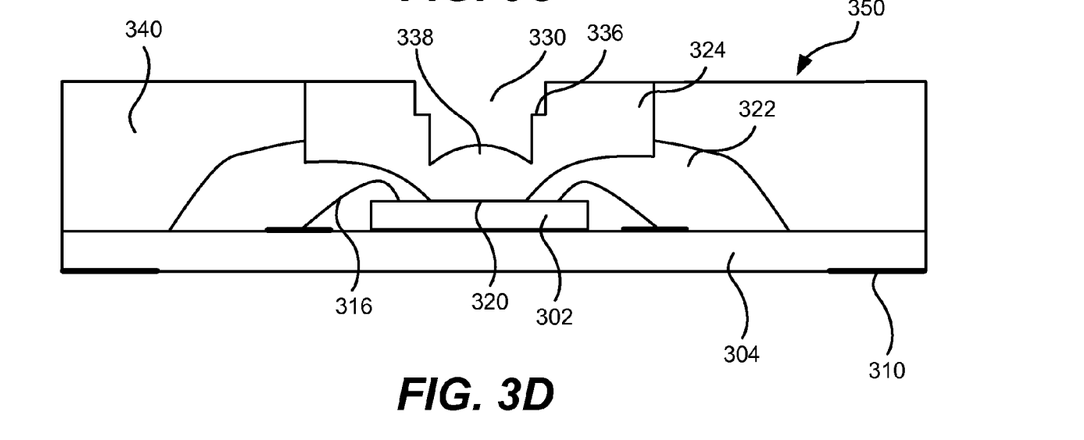
Figure 6A:
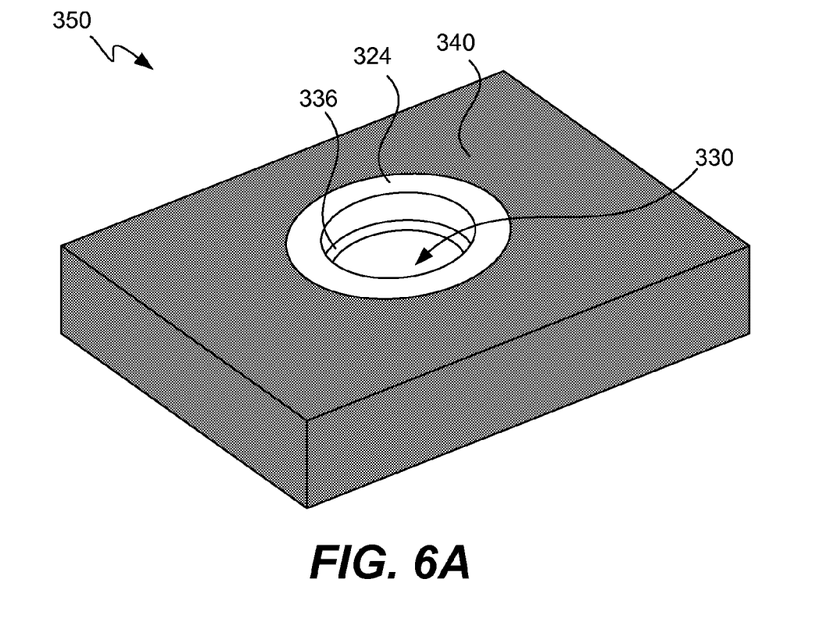
FIGS. 6A and 6B illustrate top perspective and bottom perspective views, respectively, of an example optical IC package in accordance with an embodiment of the present invention.
Figure 6B:
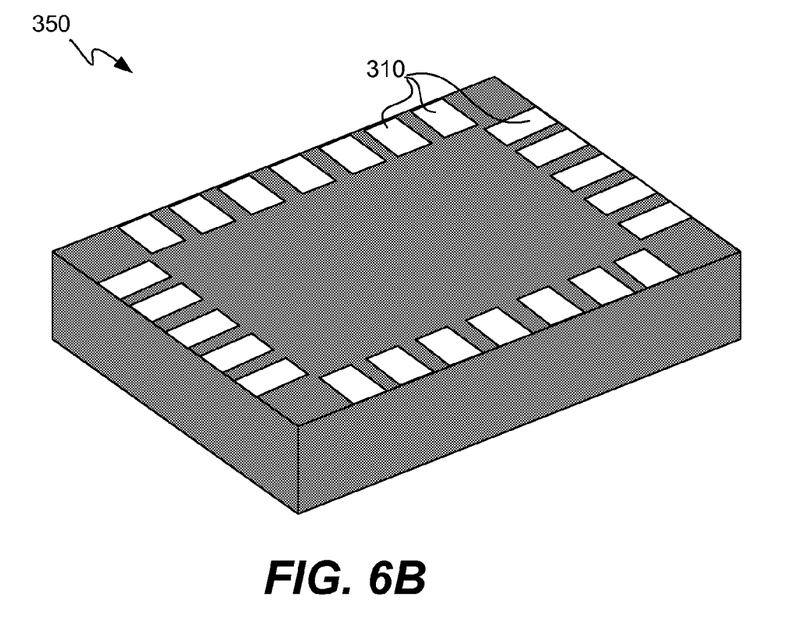

In some embodiments, the molding compound may be cured after encapsulation. At 216, the encapsulated panels may be singulated with any suitable means to provide a number of optical packages 350. FIG. 3D illustrates a cross-sectional side view of package 350 while FIGS. 6A and 6B illustrate top and bottom perspective views, respectively. In particular, FIG. 6A illustrates optical concentrator 324 with a recess 330 including lip portion 336. Lens portion 338 is located below lip portion 336. As will be readily appreciated, a variety of standard processing steps can be applied to package 350 either before or after singulation such as, by way of example, laser marking, testing, and plating of the external contact pads 310. In various embodiments, an optical fiber may then be inserted into recess 330.

In alternate embodiments in which an optically transparent molding compound 340 is used in the encapsulation, each optical concentrator 324 may be positioned over its associated die 302 without first applying any glue. In some of these embodiments, it may not be desirable to singulate the optical concentrators 324 from the insert panel 400 prior to encapsulation with molding material as the insert panel supports the optical concentrators over the associated dice. In these embodiments, portions of the support members 404 may remain encapsulated with molding material after singulation of the individual packages. In one embodiment, insert panel 400 may be fixed to and aligned with the upper mold cap 502. Any mold flashing over the light sensitive regions 320 during encapsulation may not be a concern as the molding compound 340 itself is optically transparent. In fact, in some embodiments it may be desirable to have optically transparent molding compound between the optical concentrator 324 and the light sensitive region 320.

Figure 7:
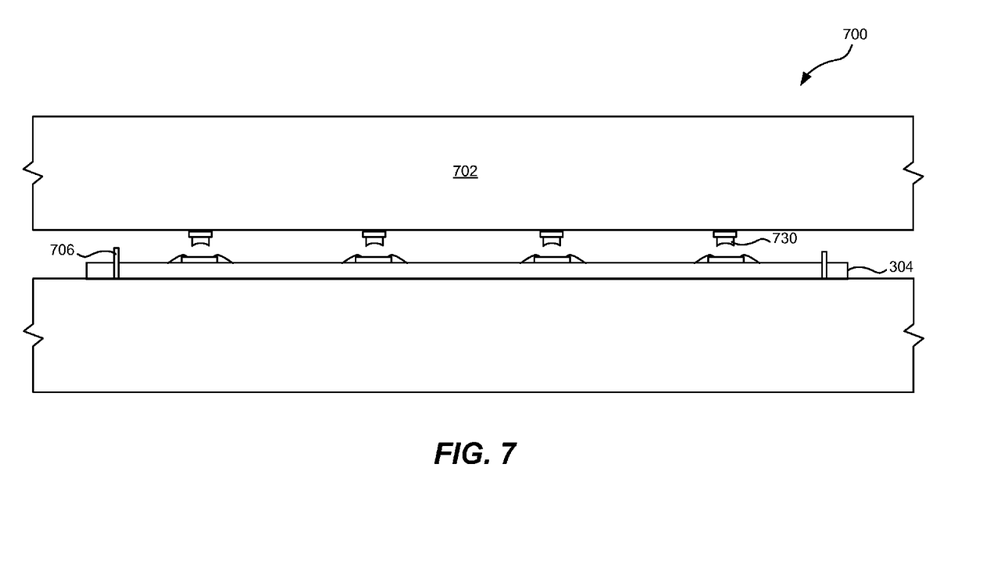
FIG. 7 illustrates an example arrangement for encapsulating optical IC packages utilizing a molded optical compound in accordance with another embodiment of the present invention.
Figure 8:
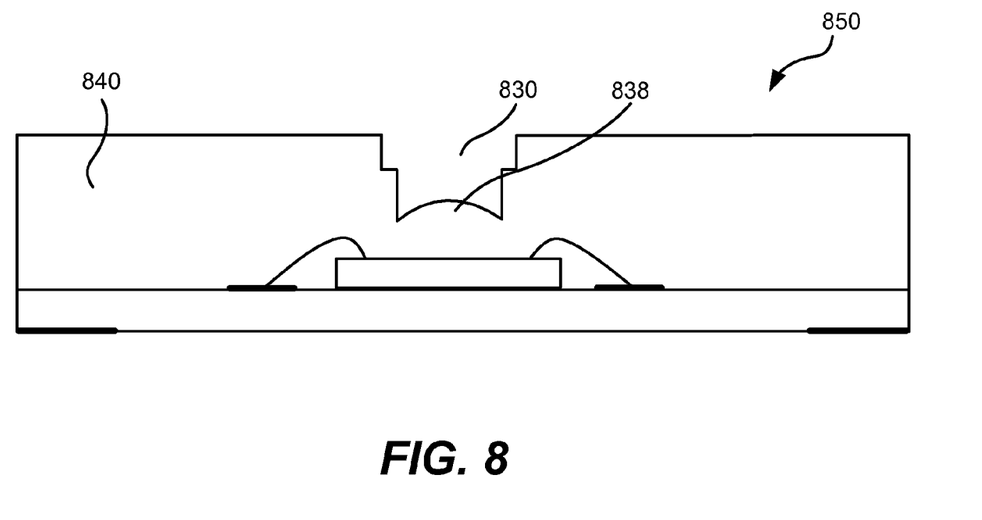
FIG. 8 illustrates a cross-sectional side view of an example optical IC package produced with the arrangement of FIG. 7.

In still other embodiments, each optical concentrator 324 may be formed from an optically transparent molding compound 340 itself. By way of example, referring to FIG. 7, a mold 700 may be designed with a customized upper mold cap 702 having projections 730. During the encapsulation process, molding material fills in the gaps around the projections 730 and between the projections and dice 302. In this way, the molding material itself forms an integral optical concentrator and coupler. FIG. 8 illustrates a cross-sectional side view of a package 850 produced in such a manner. Upon removal from the mold 700, the encapsulated substrate panel 304 includes recesses 830 left behind in the molding compound 840 from the projections 730. Each recess 830 may resemble, by way of example, recess 130 or 330 of FIGS. 1 and 3D, respectively. Additionally, the bottom surface of each protrusion 730 may be designed and curved so as to shape a lens portion 838 out of the molding compound 840. Note that in an alternate embodiment, a conventional mold may be used to encapsulate the substrate panel 304 and form the integral optical concentrators. By way of example, in one alternate embodiment, an insert panel having protrusions 730 may be appropriately positioned within the mold between the substrate panel 304 and the upper mold cap.

Packages produced in accordance with the aforementioned methods offer a number of advantages. By way of example, the incorporation of the recess in the optical concentrator provides an effective and consistent means for aligning the optical fiber with the lens portion and ultimately with the light sensitive region on the surface of the die. Furthermore, in the case of a transmitter, the lens portion focuses light emitted by the light sensitive region into the core of the optical fiber. Alignment of the optical fiber with the light sensitive region becomes increasingly important as greater data rates are desired. The inventors have determined that data rates of 10 Gbps and beyond are achievable using various methods and arrangements disclosed herein.

The optical packages disclosed herein may generally be utilized in a multitude of applications including high speed serial data links, digital cinema, television, medical, and communications among others. Furthermore, the molded optical packages described may be utilized for unidirectional, duplex or multiport (i.e. parallel fibers) links and may be utilized in configurations involving intra-device data transport, inter-rack or board data transport as found in display I/Os, blade connectors, terabit routers, telecom switches and super clusters.

By way of example, a package may be produced that includes two (or more) integrated circuit dice, each having associated light sensitive regions. In one example embodiment, a first die may serve as a photodetector while a second die may serve as an emitter of light. In this manner a single package may serve as both a transmitter and receiver. Such an embodiment may find use in duplex applications. In these embodiments, each of the two dice may include its own light sensitive region and have its own associated optical fiber coupled therewith. In some embodiments, each die has its own associated optical concentrator for coupling the die to an associated optical fiber. In an alternate embodiment, a single optical concentrator having at least two recesses and at least two lenses can be arranged to couple the light sensitive regions on each of the dice with their associated optical fibers.

In still another embodiment, a single die may include two or more light sensitive regions. Each light sensitive region on the single die may be coupled with its own optical concentrator such as any of those described above. Alternately, a single optical concentrator may include two or more lens portions and associated recesses and other coupling features for aligning an optical fiber with each of the light sensitive regions on the die. In such an embodiment, the die may be configured for parallel communication through both of the light sensitive regions.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
   a first die having at least one light sensitive region disposed on a first surface thereof;
   an optical coupling concentrator positioned adjacent the first surface of the first die, the optical concentrator including a lens portion positioned adjacent the light sensitive region and a recess configured to receive an inserted optical fiber and align the inserted optical fiber relative to the lens portion, wherein the lens portion is adapted to focus light; and molding material that encapsulates at least portions of the first die and the optical coupling concentrator, wherein the molding material covers at least portions of the first surface of the die.

2. An integrated circuit package as recited in claim 1, wherein the lens portion is adapted to focus light emitted from the light sensitive region into a core of the optical fiber.

3. An integrated circuit package as recited in claim 1, wherein the lens portion is adapted to focus light emitted from a core of the optical fiber towards the light sensitive region.

4. An integrated circuit package as recited in claim 1, wherein the optical concentrator is not formed from the molding material and the lens portion of the optical concentrator is located at a bottom of the recess.

5. An integrated circuit package as recited in claim 1, wherein the optical concentrator is formed by means of an injection molding process.

6. An integrated circuit package as recited in claim 1, wherein the optical fiber is a multimode optical fiber.

7. An integrated circuit package as recited in claim 1, wherein the optical fiber is substantially formed of a polymer material.

8. An integrated circuit package as recited in claim 1, wherein the first die comprises a vertical-cavity surface-emitting laser.

9. An integrated circuit package as recited in claim 1, wherein the first die comprises a photodetector.

10. An integrated circuit package as recited in claim 1, wherein the optical concentrator is formed of a high temperature-rated thermoplastic material.

11. An integrated circuit package as recited in claim 10, wherein the thermoplastic material is a polyimide or a polyetherimide.

12. An integrated circuit package as recited in claim 1, further comprising a substrate, wherein bond pads on the first surface of the first die are electrically connected with associated internal contact pads on the substrate.

13. An integrated circuit package as recited in claim 12, wherein the substrate is a laminate based substrate comprising high temperature FR4.

14. An integrated circuit package as recited in claim 12, wherein the substrate is a leadframe.

15. An integrated circuit package comprising:
a first die having at least one light sensitive region disposed on a first surface thereof;
an optical coupling concentrator positioned adjacent the first surface of the first die, the optical concentrator including an optical fiber coupling feature and a lens portion positioned adjacent the light sensitive region, the lens portion being adapted to focus light and the optical fiber coupling feature being arranged to align an inserted optical fiber with the lens portion wherein the optical fiber coupling feature includes a recess in an external surface of the optical coupling concentrator, the recess being adapted to receive and align the optical fiber with the lens portion, the lens portion being located at a bottom of the recess; and
molding material that encapsulates at least portions of the first die; and
wherein the recess further includes a lip portion at a first distance into the recess, the lip portion having an inner diameter that is less than an outer diameter of the optical fiber such that the optical fiber is prevented from further travel into the recess beyond the lip portion and such that an end surface of the optical fiber is at second prescribed distance from the lens portion.

16. An integrated circuit package comprising:
a first die having at least one light sensitive region disposed on a first surface thereof;
an optical coupling concentrator positioned adjacent the first surface of the first die, the optical concentrator including a lens portion positioned adjacent the light sensitive region, the lens portion being adapted to focus light; and
molding material that encapsulates at least portions of the first die; and
wherein the optical concentrator is formed from the molding material used to encapsulate the first die and is integrally formed with the molding material used to encapsulate the first die.

17. An integrated circuit package comprising:
a first die having at least one light sensitive region disposed on a first surface thereof;
an optical coupling concentrator positioned adjacent the first surface of the first die, the optical concentrator including an optical fiber coupling feature and a lens portion positioned adjacent the light sensitive region, the lens portion being adapted to focus light, and the optical fiber coupling feature being arranged to align an inserted optical fiber with the lens portion;
molding material that encapsulates at least portions of the first die; and
a second die having at least one light sensitive region disposed on a first surface thereof;
a second optical coupling concentrator positioned adjacent the first surface of the second die, the optical concentrator including a lens portion positioned adjacent the light sensitive region of the second die, the lens portion being adapted to focus light; and
a second optical fiber coupling feature, the second optical fiber coupling feature being arranged to align a second inserted optical fiber with the lens portion of the second optical coupling concentrator,
wherein the integrated circuit package is configured for duplex communication wherein the first die is configured to transmit light through the lens portion of the optical coupling concentrator associated with the first die and into the core of the optical fiber associated with the first die, and wherein the second die is configured to receive light through the lens portion of the second optical coupling concentrator from the core of the second optical fiber.

18. An integrated circuit package as, comprising:
a first die having at least one light sensitive region disposed on a first surface thereof;
an optical coupling concentrator positioned adjacent the first surface of the first die, the optical concentrator including a lens portion positioned adjacent the light sensitive region, the lens portion being adapted to focus light; and
molding material that encapsulates at least portions of the first die,
wherein the first die includes at least two light sensitive regions disposed on the first surface thereof, and wherein the optical coupling concentrator includes at least two lens portions, a first one of the lens portions being positioned adjacent a first one of the light sensitive regions and a second one of the lens portions being positioned adjacent a second one of the light sensitive regions, and wherein the optical coupling concentrator further comprises:

an optical fiber coupling feature, the optical fiber coupling feature being arranged to align a first inserted optical fiber with the first one of the lens portions and a second inserted optical fiber with the second one of the lens portions, wherein the integrated circuit package is configured for parallel communication.

19. An optical concentrator for use in an integrated circuit package that includes a die having a light sensitive region on a first surface thereof, the optical concentrator comprising:
- a lens portion configured to focus light, the lens portion being positioned adjacent the light sensitive region on the first surface of the die; and
- a recess adapted to receive a first end of an optical fiber, the first end of the optical fiber having a first surface, the lens portion being located at a bottom of the recess, wherein the recess is configured to align the first end of the optical fiber with the lens portion, and
- wherein the recess further includes a lip portion at a distance into the recess, the lip portion having an inner diameter that is less than an outer diameter of the optical fiber such that the optical fiber is prevented from further travel into the recess beyond the lip portion and such that the first end surface of the optical fiber is at second prescribed distance from the lens portion.

20. An optical concentrator as recited in claim 19, wherein the lens portion is adapted to focus light emitted from the light sensitive region into a core of the optical fiber.

21. An optical concentrator as recited in claim 19, wherein the lens portion is adapted to focus light emitted from the core of the optical fiber onto the light sensitive region.

22. An optical concentrator as recited in claim 19, wherein the optical concentrator is formed by means of an injection molding process.

23. An optical concentrator as recited in claim 19, wherein the optical concentrator is formed of a high temperature-rated thermoplastic material.

24. An optical concentrator as recited in claim 23, wherein the thermoplastic material is a polyetherimide.

* * * * *